United States Patent
Li et al.

(10) Patent No.: US 11,705,492 B2
(45) Date of Patent: Jul. 18, 2023

(54) METHOD FOR FABRICATING SEMICONDUCTOR STRUCTURE

(71) Applicant: UNITED MICROELECTRONICS CORP., Hsin-Chu (TW)

(72) Inventors: Yi-Fan Li, Tainan (TW); Kuo-Chin Hung, Changhua County (TW); Wen-Yi Teng, Kaohsiung (TW); Ti-Bin Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 145 days.

(21) Appl. No.: 17/246,726

(22) Filed: May 3, 2021

(65) Prior Publication Data

US 2021/0257471 A1    Aug. 19, 2021

Related U.S. Application Data

(60) Continuation of application No. 16/701,122, filed on Dec. 2, 2019, now Pat. No. 11,031,477, which is a division of application No. 15/853,867, filed on Dec. 25, 2017, now Pat. No. 10,541,309.

(51) Int. Cl.
| | |
|---|---|
| *H01L 29/417* | (2006.01) |
| *H01L 29/49* | (2006.01) |
| *H01L 29/423* | (2006.01) |
| *H01L 21/311* | (2006.01) |
| *H01L 29/66* | (2006.01) |
| *H01L 29/161* | (2006.01) |
| *H01L 29/78* | (2006.01) |
| *H01L 29/165* | (2006.01) |

(52) U.S. Cl.
CPC .. *H01L 29/41775* (2013.01); *H01L 21/31116* (2013.01); *H01L 29/161* (2013.01); *H01L 29/42364* (2013.01); *H01L 29/495* (2013.01); *H01L 29/6653* (2013.01); *H01L 29/66545* (2013.01); *H01L 29/66575* (2013.01); *H01L 29/7843* (2013.01); *H01L 29/165* (2013.01); *H01L 29/6656* (2013.01); *H01L 29/7848* (2013.01)

(58) Field of Classification Search
CPC ......... H01L 21/76837; H01L 21/76834; H01L 21/31116
See application file for complete search history.

(56) References Cited

U.S. PATENT DOCUMENTS

| | | | |
|---|---|---|---|
| 6,066,555 A * | 5/2000 | Nulty | H01L 21/823425 |
| | | | 257/E21.507 |
| 6,531,377 B2 | 3/2003 | Knorr | |
| 2005/0245081 A1 | 11/2005 | Chakravarti | |

(Continued)

*Primary Examiner* — John A Bodnar
(74) *Attorney, Agent, or Firm* — Winston Hsu

(57) ABSTRACT

A first gate and a second gate are formed on a substrate with a gap between the first and second gates. The first gate has a first sidewall. The second gate has a second sidewall directly facing the first sidewall. A first sidewall spacer is disposed on the first sidewall. A second sidewall spacer is disposed on the second sidewall. A contact etch stop layer is deposited on the first and second gates and on the first and second sidewall spacers. The contact etch stop layer is subjected to a tilt-angle plasma etching process to trim a corner portion of the contact etch stop layer. An inter-layer dielectric layer is then deposited on the contact etch stop layer and into the gap.

10 Claims, 3 Drawing Sheets

(56) References Cited

U.S. PATENT DOCUMENTS

| | | |
|---|---|---|
| 2011/0256726 A1 | 10/2011 | LaVoie |
| 2012/0025329 A1 | 2/2012 | Wu |
| 2014/0131804 A1 | 5/2014 | Chen |
| 2015/0145073 A1 | 5/2015 | Lee |
| 2015/0380406 A1 | 12/2015 | Chang |
| 2016/0087037 A1* | 3/2016 | Cheng ............ H01L 21/823814 438/275 |
| 2016/0343858 A1 | 11/2016 | Kim |
| 2018/0108660 A1 | 4/2018 | Pranatharthiharan |

* cited by examiner

METHOD FOR FABRICATING SEMICONDUCTOR STRUCTURE

CROSS REFERENCE TO RELATED APPLICATIONS

This is a continuation application of U.S. application Ser. No. 16/701,122 filed Dec. 2, 2019, which itself is a division of U.S. application Ser. No. 15/853,867 filed Dec. 25, 2017, which are included in their entirety herein by reference.

BACKGROUND OF THE INVENTION

1. Field of the Invention

The disclosure relates generally to the field of semiconductor technology, and more particularly, to a field effect transistor with a contact etch stop layer and manufacturing method thereof.

2. Description of the Prior Art

The integrated circuit (IC) manufacturing technology have been moving forward as the metal-oxide-semiconductor field-effect transistors (MOSFETs) become smaller and smaller to improve the performances such as increased switching speed, lowered power consumption and higher level of integration. HKMG (high-k metal gate) technology promises to enable scaling of the transistors as well as reduced stand-by power due to a reduction in gate leakage.

In the HKMG technology, an interlayer dielectric layer is typically deposited into the space between the dummy gates before performing chemical mechanical polishing (CMP). However, as the space between the dummy gates shrinks, seams or voids may form in the interlayer dielectric layer between the dummy gates, and metal residues may remain therein after the CMP and subsequent deposition of a metal layer for forming a metal gate, which results in problems such as electrical shorting or metal bridging.

One approach to solving the aforesaid problem has been to reduce the thickness of the contact etch stop layer (CESL). However, thickness reduction of the CESL may lead to degradation of the device performance due to insufficient tensile strain. Therefore, there is still a need in this industry to provide an improved method for fabricating a metal gate transistor device without compromise of the device performance.

SUMMARY OF THE INVENTION

It is one object of the present invention to provide a field effect transistor with a contact etch stop layer and a method for making the same in order to solve the above-mentioned prior art shortcomings or problems.

In order to achieve the foregoing object, in one embodiment, the present invention provides a method for fabricating a semiconductor device. A first gate and a second gate are formed on a substrate with a gap between the first and second gates. The first gate has a first sidewall. The second gate has a second sidewall directly facing the first sidewall. A first sidewall spacer is disposed on the first sidewall. A second sidewall spacer is disposed on the second sidewall. A contact etch stop layer is deposited on the first and second gates and on the first and second sidewall spacers. The contact etch stop layer is subjected to a tilt-angle plasma etching process to trim a corner portion of the contact etch stop layer. An inter-layer dielectric layer is then deposited on the contact etch stop layer and into the gap.

According to one aspect of the invention, a semiconductor structure is disclosed. The semiconductor structure includes a first metal gate and a second metal gate on a substrate with a gap between the first and second metal gates. The first metal gate has a first sidewall, and the second metal gate has a second sidewall directly facing the first sidewall. A contact etch stop layer is disposed within the gap and extending along the first sidewall and the second sidewall. The contact etch stop layer has a first top portion adjacent to a top surface of the first metal gate and a second top portion adjacent to a top surface of the second metal gate. The first top portion and the second top portion have a trapezoid cross-sectional profile. A first sidewall spacer is disposed on the first sidewall and between the contact etch stop layer and the first metal gate. A second sidewall spacer is disposed on the second sidewall and between the contact etch stop layer and the second metal gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1:
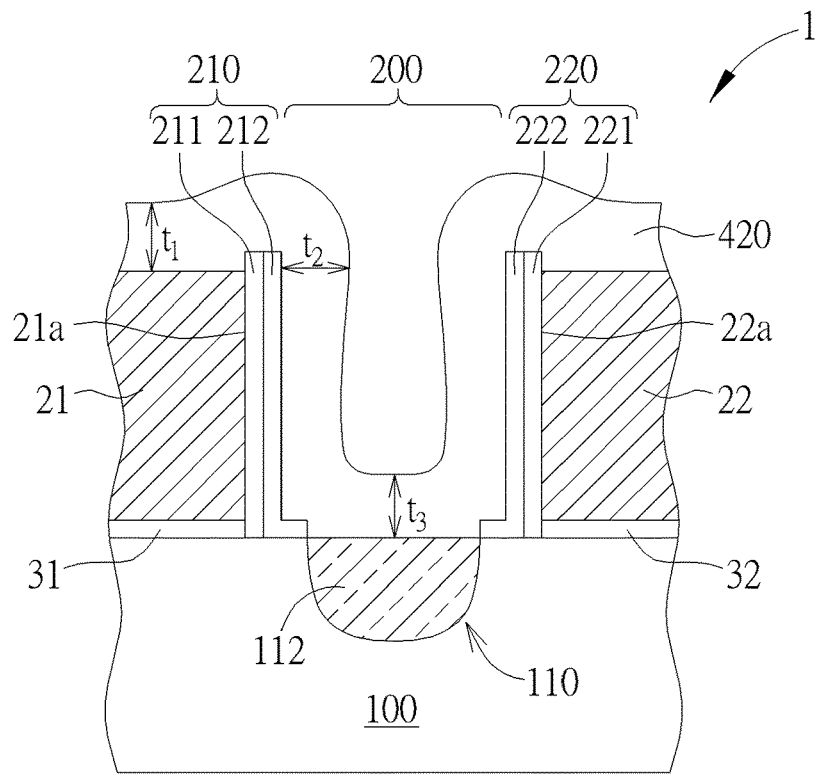
FIG. 1 to FIG. 5 are schematic, cross-sectional diagrams showing a method for fabricating a semiconductor device according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1 to FIG. 5. FIG. 1 to FIG. 5 are schematic, cross-sectional diagrams showing a method for fabricating a semiconductor device 1 according to one embodiment of the invention. As shown in FIG. 1, a substrate 100 is provided. The substrate 100 may be a semiconductor substrate such as a silicon substrate, an epitaxial substrate, a silicon-on-insulator (SOI) substrate, or the like.

According to one embodiment of the invention, a first dummy gate 21 and a second dummy gate 22 are formed on the substrate 100 with a gap 200 between the first dummy gate 21 and the second dummy gate 22. According to one embodiment of the invention, the first dummy gate 21 and the second dummy gate 22 may be composed of polysilicon, but is not limited thereto. A first gate dielectric layer 31 may be formed between the first dummy gate 21 and the substrate 100. A second gate dielectric layer 32 may be formed between the second dummy gate 22 and the substrate 100.

According to one embodiment of the invention, the first dummy gate 21 has a first sidewall 21a and the second dummy gate 22 has a second sidewall 22a directly facing the first sidewall 21a. A first sidewall spacer 210 is disposed on the first sidewall 21a. A second sidewall spacer 220 is disposed on the second sidewall 22a. According to one embodiment of the invention, for example, the first sidewall spacer 210 may comprise a SiOCN seal layer 211 and a SiN spacer 212. According to one embodiment of the invention, for example, the second sidewall spacer 220 may comprise a SiOCN seal layer 221 and a SiN spacer 222. Optionally, lightly doped drain (LDD) regions (not shown) may be formed directly under the first sidewall spacer 210 and the second sidewall spacer 220, respectively.

According to one embodiment of the invention, a source/drain region 110 is disposed in the substrate 100 between the first dummy gate 21 and the second dummy gate 22. According to one embodiment of the invention, an epitaxial layer 112 may be disposed in the source/drain region 110. For example, the epitaxial layer 112 may comprise SiGe when the semiconductor device 1 is a PMOS transistor device.

After removing a cap layer from the top of each of the first dummy gate 21 and the second dummy gate 22, the tip portion of each of the first sidewall spacer 210 and the second sidewall spacer 220 may slightly protrude from a top surface of the first dummy gate 21 or the second dummy gate 22.

According to one embodiment of the invention, a contact etch stop layer 420 is deposited on the first dummy gate 21 and the second dummy gate 22, and on the first sidewall spacer 210 and the second sidewall spacer 220. The upwardly protruding tip portions of the first sidewall spacer 210 and the second sidewall spacer 220 cause overhang issue at the upper opening of the gap 200, which narrows the gap fill window when depositing an interlayer dielectric layer into the gap 200. A defective seam may be formed in the gap and may result in electrical shorting or metal bridging. The present invention addresses this issue.

According to one embodiment of the invention, the contact etch stop layer 420 may be a tensile-stressed silicon nitride film, but is not limited thereto. According to one embodiment of the invention, the contact etch stop layer 420 has a first thickness $t_1$ at the top surface of the first dummy gate 21 or the second dummy gate 22, a second thickness $t_2$ near the tip portions of the first sidewall spacer 210 and the second sidewall spacer 220, and a third thickness $t_3$ at the bottom of the gap 200. For example, the first thickness $t_1$ may be 18~19 nm, the second thickness $t_2$ may be 13~14 nm, and the third thickness $t_3$ may be 14~15 nm.

Figure 2:
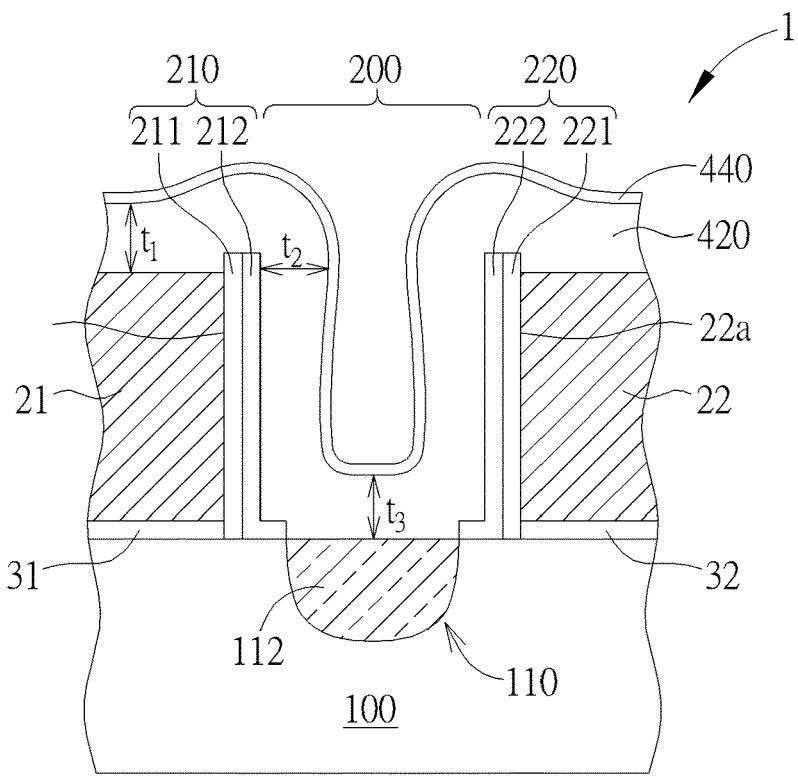
Figure 3:
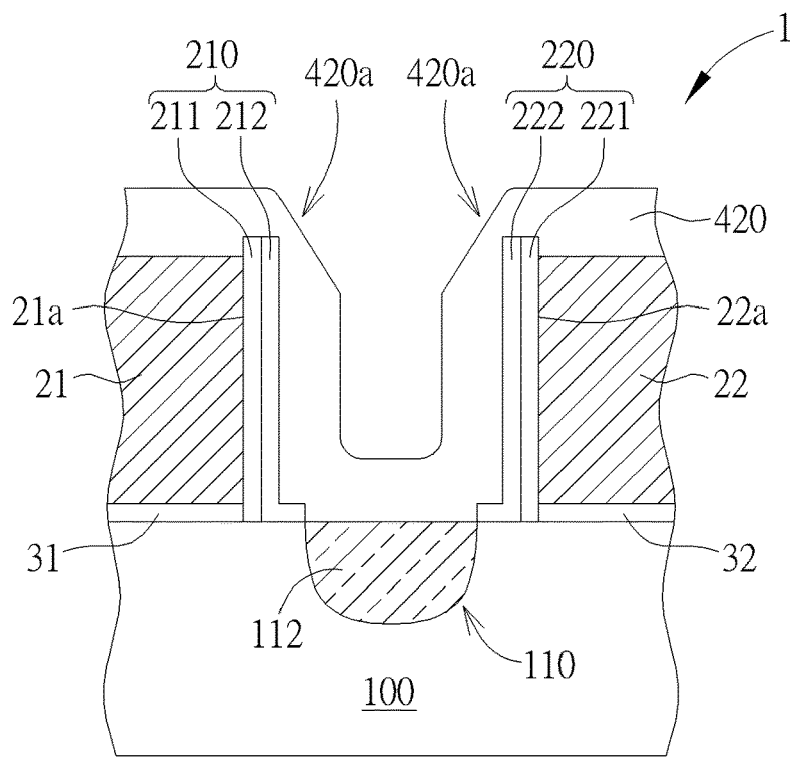

As shown in FIG. 2 to FIG. 3, a trimming process is performed. The trimming process starts with depositing a thin protection layer 440 on the contact etch stop layer 420. For example, the protection layer 440 may be a silicon dioxide layer and may be deposited by using an atomic layer deposition (ALD) method. For example, the silicon dioxide layer may be deposited with a flowrate of $SiH_4$ ranging 5~200 sccm, a flowrate of $PH_3$ ranging 1~100 sccm, and a flowrate of $O_2$ ranging 50~500 sccm.

After the deposition of the protection layer 440, the protection layer 440 and the contact etch stop layer 420 are subjected to a tilt-angle plasma etching process to trim an upper corner portion of the contact etch stop layer 420, which is adjacent to a tip portion of each of the first and second sidewall spacers 210 and 220.

For example, the tilt-angle plasma etching process is carried out with a flowrate of an etchant gas containing fluorine ranging 10~500 sccm, a flowrate of a carrier gas ranging 100~500 sccm, and a RF bias power ranging between 500~2000 Watts at a frequency of approximately 13.6 Mhz. For example, the tilt-angle plasma etching process may be carried out in a plasma reactor with tiltable overhead RF inductive source. According to one embodiment of the invention, the etchant gas containing fluorine may comprise $NF_3$. According to one embodiment of the invention, the carrier gas may comprise He.

As can be seen in FIG. 3, after the tilt-angle plasma etching process, the upper corner portions of the contact etch stop layer 420 are pared off and inclined flat surfaces 420a are present at the upper opening of the gap 200. The inclined flat surfaces 420a result from the anisotropic etching during the tilt-angle plasma etching process.

Clearly, as shown in FIG. 3, the upper opening of the gap 200 is widened after the tilt-angle plasma etching process. Further, to induce sufficient tensile strain into the channel regions under the first dummy gate 21 and the second dummy gate 22, an adequate thickness (e.g., 14 nm) of the contact etch stop layer 420 at the bottom of the gap 200 is maintained. According to one embodiment of the invention, the thickness of the contact etch stop layer 420 directly on the source/drain region 110 is greater than the thickness of the contact etch stop layer 420 directly on the first sidewall 21a and the second sidewall 22a.

Figure 4:
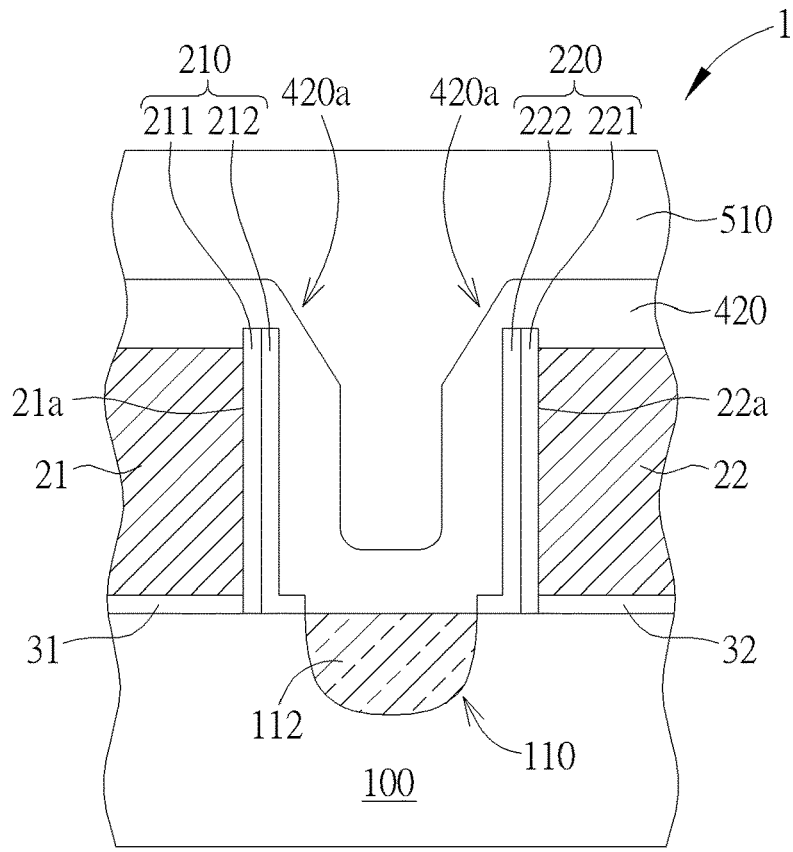

As shown in FIG. 4, subsequently, an inter-layer dielectric (ILD) layer 510 such as a silicon oxide layer is deposited on the contact etch stop layer 420 and into the gap 200. Since the upper opening of the gap 200 is widened by the tilt-angle plasma etching process, no seam is formed in the gap 200. The gap 200 can be completely filled with the ILD layer 510.

Figure 5:
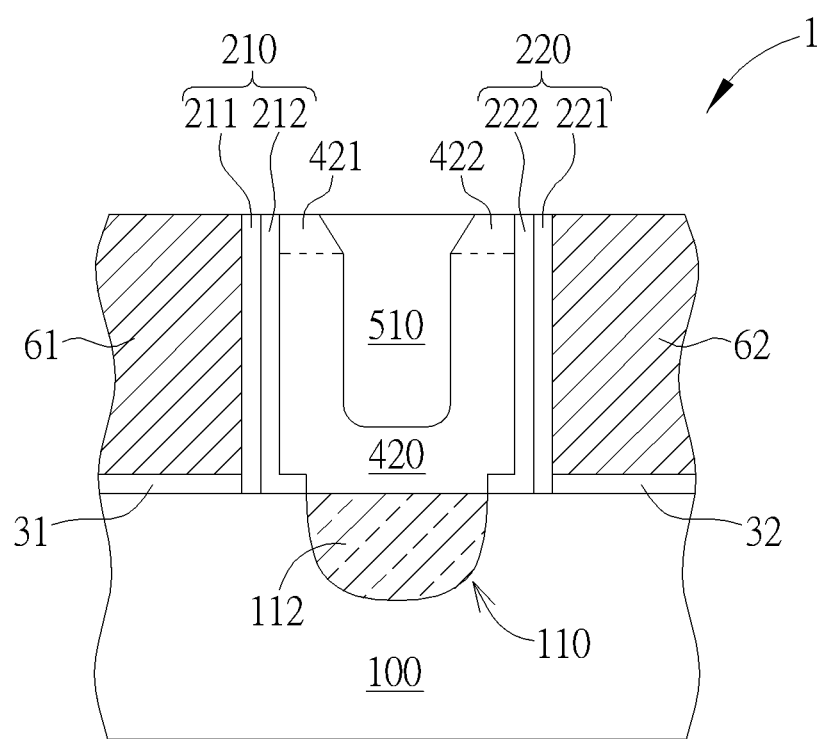

As shown in FIG. 5, thereafter, the ILD layer 510 and the contact etch stop layer 420 are subjected to a polishing process to expose a top surface of each of the first and second dummy gates 21 and 22. For example, the polishing process may be a chemical mechanical polishing (CMP) process. Thereafter, the first and second dummy gates 21 and 22 are replaced with first and second metal gates 61 and 62, respectively. For example, the first and second metal gates 61 and 62 may comprise aluminum.

A structural feature is also shown in FIG. 5. After CMP, the top surface of the remaining ILD layer 510 in the gap 200, the top surfaces the first and second sidewall spacers 210 and 220, and the top surfaces of the first and second metal gates 61 and 62 are coplanar. The contact etch stop layer 420 is disposed within the gap 200 and continuously extends along the first sidewall 21a and the second sidewall 22a and along the top surface of the source/drain region 110. The contact etch stop layer 420 has a first top portion 421 adjacent to a top surface of the first metal gate 61 and a second top portion 422 adjacent to a top surface of the second metal gate 62. The first top portion 421 and the second top portion 422 have a trapezoid cross sectional profile. More specifically, the trapezoid cross sectional profile is a right trapezoid (also called right-angled trapezoid) shape with two adjacent right angles.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for fabricating a semiconductor device, comprising:
providing a substrate;
forming a first gate and a second gate on the substrate with a gap between the first and second gates, wherein the first gate has a first sidewall, and the second gate has a second sidewall directly facing the first sidewall, and wherein a first sidewall spacer is disposed on the first sidewall, and a second sidewall spacer is disposed on the second sidewall;
depositing a contact etch stop layer on the first and second gates and on the first and second sidewall spacers;
depositing a protection layer on the contact etch stop layer, wherein the protection layer comprises a silicon dioxide layer;
subjecting the contact etch stop layer to a plasma etching process to trim a corner portion of the contact etch stop layer; and
depositing an inter-layer dielectric layer on the contact etch stop layer and into the gap.

2. The method according to claim 1, wherein the corner portion of the contact etch stop layer is adjacent to a top portion of each of the first and second sidewall spacers.

3. The method according to claim 1, wherein the contact etch stop layer is a tensile-stressed contact etch stop layer.

4. The method according to claim 1, wherein the silicon dioxide layer is deposited with a flowrate of $SiH_4$ ranging 5~200 sccm, a flowrate of $PH_3$ ranging 1~100 sccm, and a flowrate of $O_2$ ranging 50~500 sccm.

5. The method according to claim 1, wherein the plasma etching process is carried out with a flowrate of an etchant gas containing fluorine ranging 10~500 sccm, a flowrate of a carrier gas ranging 100~500 sccm, and a RF bias power ranging between 500~2000 Watts at a frequency of approximately 13.6 Mhz.

6. The method according to claim 5, wherein the etchant gas containing fluorine comprises $NF_3$.

7. The method according to claim 5, wherein the carrier gas comprises He.

8. The method according to claim 1 further comprising:
polishing the inter-layer dielectric layer and the contact etch stop layer to expose a top surface of each of the first and second gates; and
replacing the first and second gates with first and second metal gates, respectively.

9. The method according to claim 8, wherein the first and second metal gates comprise aluminum.

10. The method according to claim 1, wherein a source/drain region is disposed in the substrate between the first and second gates.

* * * * *